United States Patent [19]
Hwang et al.

[11] Patent Number: 6,077,736
[45] Date of Patent: Jun. 20, 2000

[54] METHOD OF FABRICATING A SEMICONDUCTOR DEVICE

[75] Inventors: Hyun Sang Hwang, Daejeon-si; Jae Gyung Ahn, Chungcheongbuk-do, both of Rep. of Korea

[73] Assignee: LG Semicon Co., Ltd., Chungcheongbuk-Do, Rep. of Korea

[21] Appl. No.: 08/770,156

[22] Filed: Dec. 19, 1996

[30] Foreign Application Priority Data

Jun. 10, 1996 [KR] Rep. of Korea ............. 96-20638

[51] Int. Cl.⁷ ............................... H01L 21/8238
[52] U.S. Cl. .................. 438/231; 438/203; 438/275; 438/279; 438/301; 438/232; 438/367
[58] Field of Search .................. 438/203, 220, 438/231, FOR 168, 286, 301–307, 275, 279, 232, 367; 257/344, 346, 408, 500, 336, 900

[56] References Cited

U.S. PATENT DOCUMENTS

| | | | |
|---|---|---|---|
| 4,736,233 | 4/1988 | McDavid | 357/23.9 |
| 4,935,379 | 6/1990 | Toyoshima | 438/279 |
| 4,977,099 | 12/1990 | Kotaki | 438/305 |
| 5,024,960 | 6/1991 | Haken | 438/200 |
| 5,329,482 | 7/1994 | Nakajima et al. | 438/305 |
| 5,396,098 | 3/1995 | Kim et al. | 257/344 |
| 5,438,008 | 8/1995 | Ema | 438/305 |
| 5,514,611 | 5/1996 | Kim et al. | 438/307 |
| 5,527,722 | 6/1996 | Hutter et al. | 438/231 |
| 5,614,432 | 3/1997 | Goto | 438/231 |
| 5,672,527 | 9/1997 | Lee | 438/305 |
| 5,686,324 | 11/1997 | Wang et al. | 438/231 |
| 5,719,424 | 2/1998 | Ahmad et al. | 438/307 |
| 5,834,352 | 11/1998 | Choi | 438/275 |
| 5,841,174 | 11/1998 | Arai | 257/392 |

*Primary Examiner*—Carl Whitehead, Jr.
*Assistant Examiner*—Khanh Duong
*Attorney, Agent, or Firm*—Morgan, Lewis & Bockius LLP

[57] ABSTRACT

A method of fabricating a semiconductor device includes the steps of preparing a semiconductor substrate having a first region and a second region, forming a first gate electrode and a second gate electrode over the semiconductor substrate at the first and second regions, respectively, implanting a first impurity ion into the substrate of the first region using the first gate electrode as a mask, implanting a second impurity ion into the substrate of the second region using the second gate electrode as a mask, forming sidewall spacers at both sides of each of the first and second gate electrodes, and implanting the second impurity ion into the first and second regions using the first and second gate electrodes and the sidewall spacers as masks.

26 Claims, 6 Drawing Sheets

METHOD OF FABRICATING A SEMICONDUCTOR DEVICE

BACKGROUND OF THE INVENTION

1. Field of the Invention

The present invention relates to a method of fabricating a semiconductor device, and more particularly, to a method of fabricating an MOS device.

2. Discussion of the Related Art

In general, with a worldwide trend toward high integration, high density, and high performance that quadruples over approximately every three-year period, miniaturization of semiconductor devices has been rapid. However, the miniaturization of the semiconductor devices have resulted in a strengthened field intensity which has deteriorated the characteristics of the semiconductor devices. The strengthened field intensity has caused other problems as well.

As the width of a gate becomes narrow, a field collection occurs in a drain region that is high so as to affect the characteristics of the semiconductor device. To reduce such a field, a low-concentration doping with a slow profile has to be performed between the drain region and a channel. That is, doping is heavily performed in the source and drain regions, but lightly performed in a region adjacent to the channel to form a lightly doped drain (LDD) structure.

A dopant such as phosphorus (P) or arsenic (As) has been used when forming the LDD structure of NMOS. For a wide doping profile using P, a high breakdown voltage BV of 8 V or more occurs in a device having a long channel with a length of 0.5 um or more. When using As, a breakdown voltage BV of 6 V or more occurs in a device having a short channel with a length of 0.3 um or more. However, this has brought another problem. For example, the reliability of the device deteriorates from implanting the same ion into all the devices having separate channel characteristics, respectively. In other words, when using P as a dopant, minimization of the channel cannot be achieved but a high enough breakdown voltage can be achieved. When using As as a dopant, a high breakdown voltage BV cannot be achieved but characteristics of a short channel length can be achieved.

A conventional method of fabricating a semiconductor device will now be described with reference to the appended drawings.

FIGS. 1a to 1d are sectional views showing fabricating processes of a conventional MOS device.

As shown in FIG. 1a, a first insulating film 2, a poly-crystal silicon and a second insulating film 4 are sequentially deposited on an N type semiconductor substrate 1. Then, the first insulating film 2, the poly-crystal silicon and the second insulating film 4 are selectively removed by photolithography and etching process to form a plurality of gate electrodes 3 having a separate channel length, respectively.

As shown in FIG. 1b, low-concentration impurity ions such as P or As are implanted into the entire surface of the substrate 1 including the gate electrodes 3 to form an LDD region 5 on the substrate 1 at both sides of the electrodes 3. As shown in FIG. 1c, a third insulating film is formed on the entire surface of the substrate 1 including the gate electrodes 3. Gate sidewall spacers 6 are formed at both sides of the gate electrodes 3 by an anisotropic etching. As shown in FIG. 1d, high-concentration impurity ions are implanted into the entire surface of the substrate 1 including the gate electrodes 3 to form source and drain regions 7 in the substrate 1 at both sides of the gate sidewall spacers 6.

However, the conventional method of fabricating a semiconductor device as discussed above has several problems.

First, by implanting the same LDD ions such as P or As into all the devices having separate channel characteristics respectively, the reliability of the device deteriorates since a voltage applied to a circuit varies depending on the respective device. Thus, using P as a dopant is suitable for a high voltage device since the breakdown voltage BV is high enough. However, it is not suitable for a low voltage device having a minimum channel length.

On the other hand, using As as a dopant is suitable for a low voltage device having characteristics of a short channel length. However, it is not suitable for a high voltage device having a high breakdown voltage.

SUMMARY OF THE INVENTION

Accordingly, the present invention is directed to a method of fabricating a semiconductor device that substantially obviates one or more of the problems due to limitations and disadvantages of the related art.

An object of the present invention is to provide a method of fabricating a semiconductor device for improving the reliability of the semiconductor device to improve the reliability of the semiconductor device in which an LDD structure is formed by implanting low-concentration impurity ions suitable for channel characteristics of respective devices.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve this and other advantages and in accordance with the purpose of the present invention, as embodied and broadly described, the method of fabricating a semiconductor device comprises the steps of preparing a semiconductor substrate having a first region and a second region; forming a first gate electrode and a second gate electrode over the semiconductor substrate at the first and second regions, respectively; implanting a first impurity ion into the substrate of the first region using the first gate electrode as a mask; implanting a second impurity ion into the substrate of the second region using the second gate electrode as a mask; forming sidewall spacers at both sides of each of the first and second gate electrodes; and implanting the second impurity ion into the first and second regions using the first and second gate electrodes and the sidewall spacers as masks.

In another aspect of the present invention, a method of fabricating a semiconductor device comprises the steps of preparing a first conductivity type substrate having a first area and a second area; forming a first gate electrode and a second gate electrode on the substrate at the first and second areas, respectively; masking the first region including the first gate electrode with a first material; forming a first impurity region having a first impurity concentration by implanting a first impurity ion of a second conductivity type into the second area of the substrate using the second gate electrode as a mask; removing the first material; forming a second impurity region having a second impurity concentration by implanting a second impurity ion of a second conductivity type into the first area of the substrate using the first gate electrode as a mask; forming sidewall spacers at sides of the first and second gate electrodes; and forming a third impurity region having a third impurity concentration by implanting a third impurity ion of the second conductivity type into the first and second areas using the first and second gate electrodes and the sidewall spacers as masks.

In another aspect of the present invention, a method of fabricating a semiconductor device comprises the steps, of preparing a first conductivity type substrate having a first area and a second area; forming a first gate electrode and a second gate electrode on the substrate at the first and second areas, respectively; masking the first region including the first gate electrode with a first material; forming a first impurity region having a first impurity concentration by implanting a first impurity ion of a second conductivity type into the second area of the substrate using the second gate electrode as a mask; removing the first material; forming a second impurity region having a second impurity concentration by implanting a second impurity ion of a second conductivity type into the first area of the substrate using the first gate electrode as a mask; forming sidewall spacers at sides of the first and second gate electrodes; forming a third impurity region having a third impurity concentration by implanting a third impurity ion of the second conductivity type into the first and second areas using the first and second gate electrodes and the sidewall spacers as masks; removing the first material; masking the second area with a second material after removing the first material; forming a second impurity region having a second impurity concentration by implanting a second impurity ion of a second conductivity type into the first area of the substrate using the first gate electrode as a mask; removing the second material; forming a second impurity region having a second impurity concentration by implanting a second impurity ion of a second conductivity type into the first area of the substrate using the first gate electrode as a mask; forming sidewall spacers at sides of the first and second gate electrodes; and forming a third impurity region having a third impurity concentration by implanting a third impurity ion of the second conductivity type into the first and second areas using the first and second gate electrodes and the sidewall spacers as masks.

In another aspect of the present invention, the method of fabricating a semiconductor device according to the present invention comprises the steps of preparing a semiconductor substrate having a first region and a second region; forming a first gate electrode and a second gate electrode on the semiconductor substrate of the first region and the second region; implanting a first impurity ion into the substrate of the first region using the first gate electrode as a mask; implanting a second impurity ion into the substrate of the second region using the second gate electrode as a mask; forming sidewall spacers at both sides of the first and second gate electrodes; and implanting the second impurity ion into the first and second regions using the first and second gate electrodes and the sidewall spacers as a mask. The gate electrode of the first region is formed with a channel length shorter than that of the second gate electrode of the second region. The first and second impurity ions are either n conductivity type or p conductivity type. The substrate is formed with a conductivity type different from that of the first and second impurity ions.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 4 is a graph showing the breakdown voltage characteristics according to channel lengths of devices using P and As.

DETAILED DESCRIPTION OF THE PREFERRED EMBODIMENTS

Reference will now be made in detail to the preferred embodiments of the present invention, examples of which are illustrated in the accompanying drawings.

FIGS. 2a to 2f are sectional views showing a process for fabricating an MOS device according to the first embodiment of the present invention.

Figure 1A:
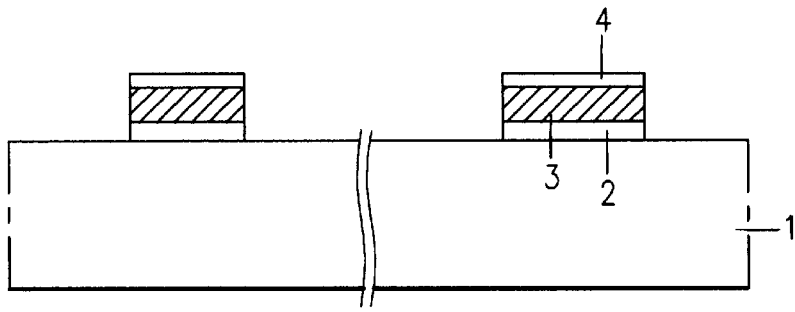
FIGS. 1a to 1d are sectional views showing a process for fabricating a conventional MOS device.
Figure 1B:
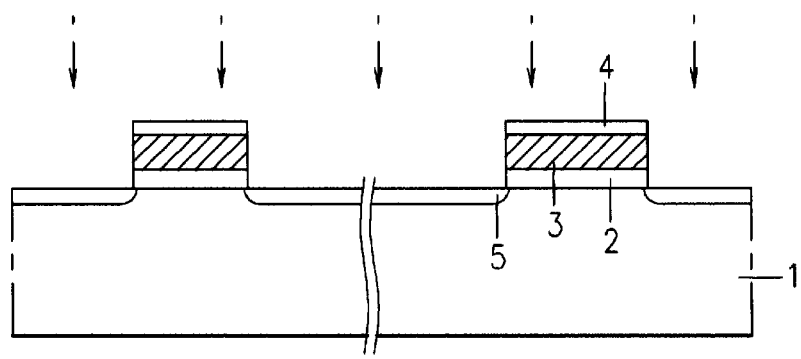
Figure 1C:
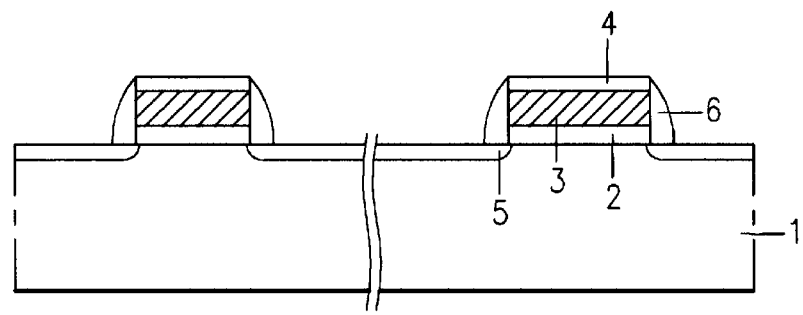
Figure 1D:
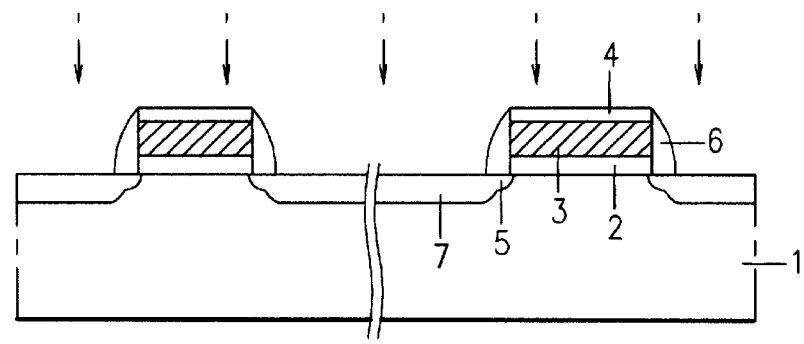
Figure 2A:
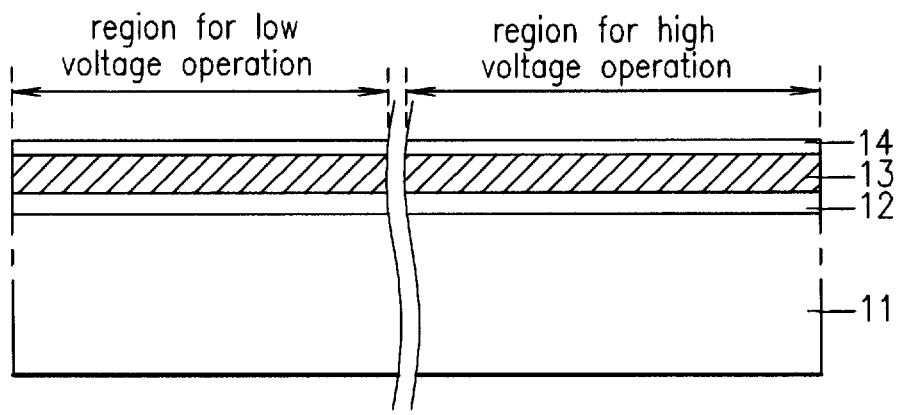
FIGS. 2a to 2f are sectional views showing a process for fabricating an MOS device according to the first embodiment of the present invention.

As shown in FIG. 2a, a first insulating film 12 (such as an oxide film, and particularly a thermal oxide film), a poly-crystal silicon 13, and a second insulating film 14 (for example, oxide film) are sequentially deposited on a p type semiconductor substrate 11 including a region for low voltage operation and a region for high voltage operation.

Figure 2B:
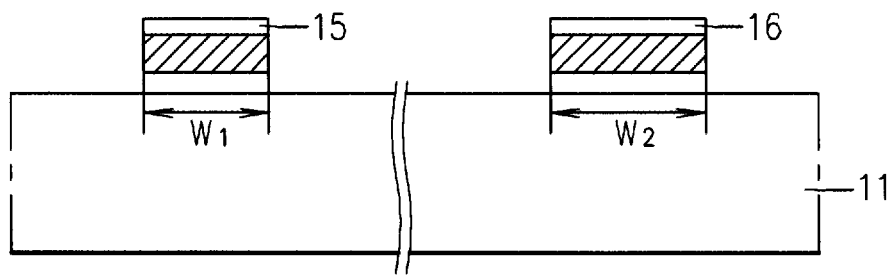

As shown in FIG. 2b, the first insulation film 12, the poly-crystal silicon 13, and the second insulating film 14 are selectively removed by an etching process such as photolithography. As a result, a first gate electrode 15 is formed at the region for low voltage operation and a second gate electrode 16 is formed at the region for high voltage operation. The second gate electrode 16 is formed with a width $W_2$ which is wider than a width $W_1$ of the first gate electrode 15 for forming a long channel.

Figure 2C:
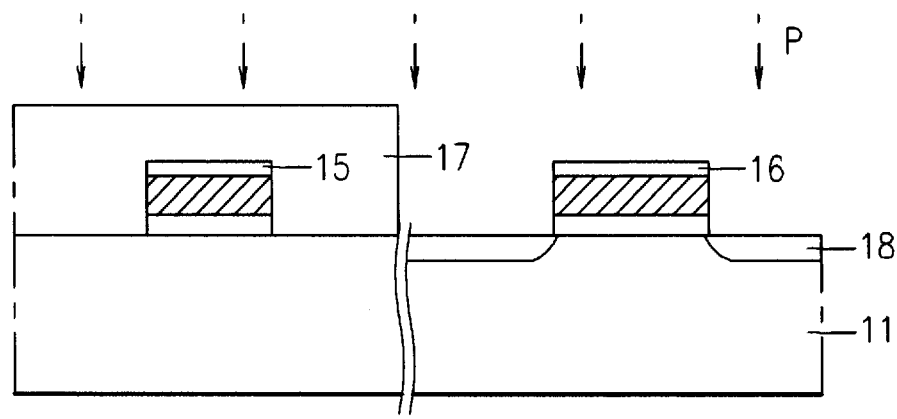

As shown in FIG. 2c, the region for low voltage operation including the first gate electrode 15 is masked by a sensitivity (photoresist) film 17. Then, a first impurity ion is lightly implanted into the region for high voltage operation of the substrate 11 using the second gate electrode 16 as a mask, so that first low-concentration impurity regions 18 are formed in the substrate at both sides of the second gate electrode 16. At this time, the first impurity ion includes phosphorus(P) of n conductivity type which is different from the conductivity type of the p type substrate 11. The process for implanting phosphorus ions is carried out with a dose quantity of 1E13–14 atom/cm$^2$ (typically 3E13 atom/cm$^2$) and an energy of 10–50 KeV (typically 30 KeV).

Figure 2D:
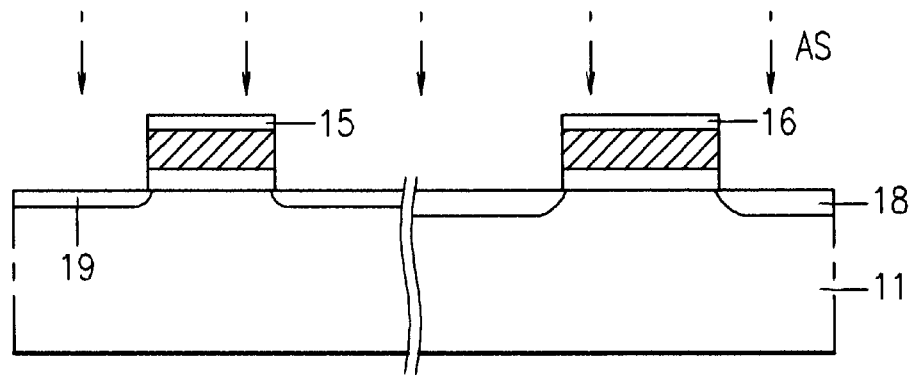

As shown in FIG. 2d, the photoresist film 17 of the region for low voltage operation is removed. Then, a second impurity ion having a conductivity type identical to the first impurity ion is lightly implanted into the entire surface of the substrate using the first gate electrode 15 and the second gate electrode 16 as a mask. As a result of ion implantation, second low-concentration impurity regions 19 are formed in the region for low voltage operation. The diffusivity of the second impurity ions is less than that of the first impurity ions. At this time, the second impurity ion includes As of n conductivity type, which is different from a conductivity type of the p type substrate 11. The process for implanting As ions are carried out with a dose quantity of 1E13–14 atom/cm$^2$ (typically 3E13 atom//cm$^2$) and an energy of 10–50 KeV, typically 30 KeV.

In addition, although P and As of n conductivity type impurities are implanted into the region for high voltage operation, channel characteristics is not affected since a junction depth of P is greater than that of As.

Figure 2E:
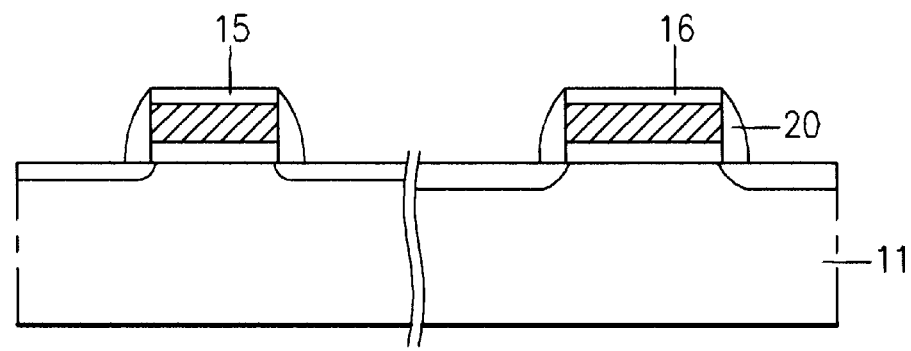

As shown in FIG. 2e, a third insulating film is formed on the substrate 11 including the first gate electrode 15 and the second gate electrode 16. Then, insulated sidewall spacers 20 are formed at both sides of the first and second gate electrodes 15 and 16 by performing a responsive ion etching process on the third insulating film.

Figure 2F:
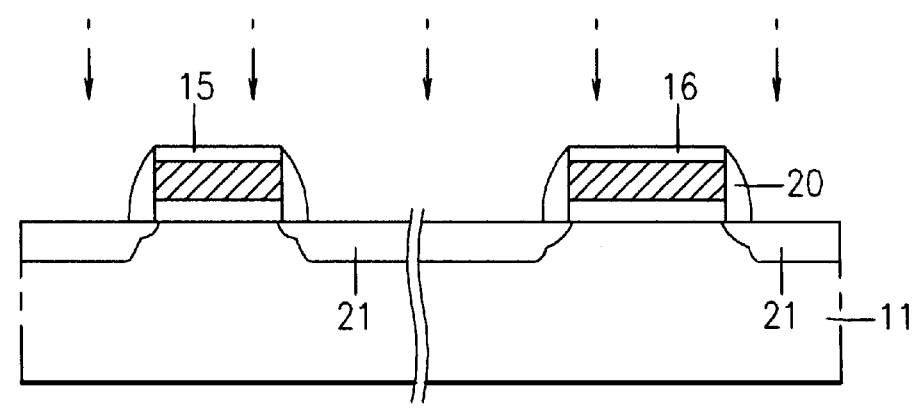

As shown in FIG. 2f, high-concentration impurity regions 21 are formed by heavily to implanting the second impurity ion including As into the substrate 11 using the first gate electrode 15, the second gate electrode 16, and the insulated sidewall spacers 20 as a mask. The processing for implanting As ions are carried out with a dose quantity of 1E15–5E15 atom/cm$^2$ (typically 3E15 atom/cm$^2$) and an energy of 10–50 KeV (typically 30 KeV).

FIGS. 3a to 3f are sectional views showing fabricating processes of an MOS device according to the second embodiment of the present invention.

Figure 3A:
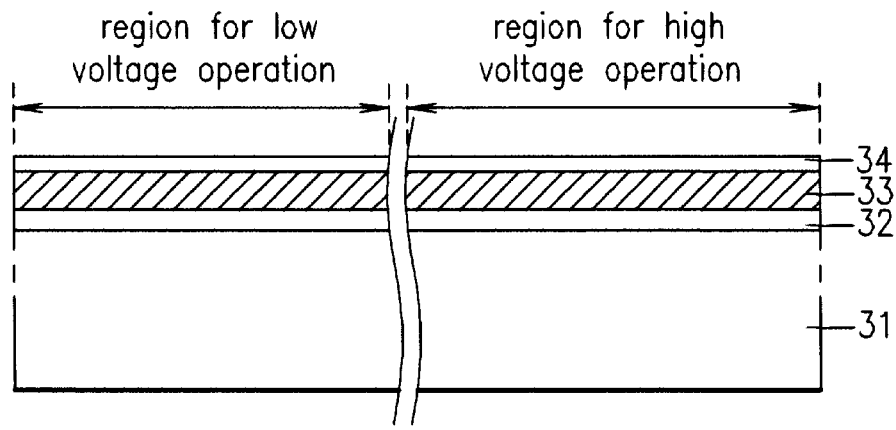
FIGS. 3a to 3f are sectional views showing a process for fabricating an MOS device according to the second embodiment of the present invention.

As shown in FIG. 3a, a first insulating film 32 (such as an oxide film, and particularly thermal oxide film), a poly-crystal silicon 33, and a second insulating film 34 (for example, oxide film) are sequentially deposited on an N type semiconductor substrate 31 including a region for low voltage operation and a region for high voltage operation.

Figure 3B:
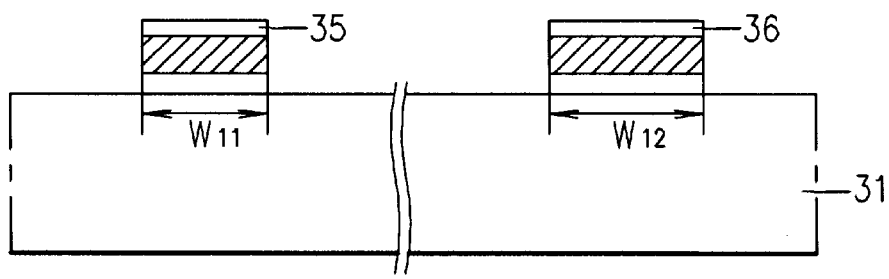

As shown in FIG. 3b, the first insulation film 32, the poly-crystal silicon 33, and the second insulating film 34 are selectively removed by an etching process such as photolithography. As a result, a first gate electrode 35 is formed at the region for low voltage operation and a second gate electrode 36 is formed at the region for high voltage operation. At this time, the second gate electrode 36 is formed having a width $W_{12}$ that is wider than a width $W_{11}$ of the first gate electrode 35 for forming of a long channel.

Figure 3C:
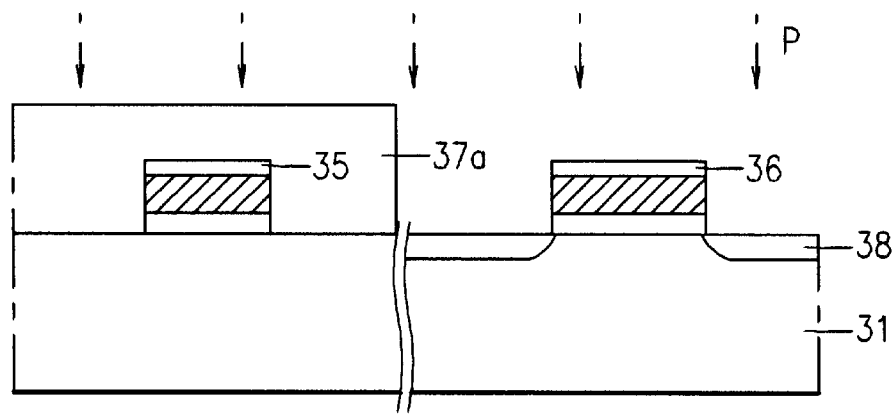

As shown in FIG. 3c, the region for low voltage operation including the first gate electrode 35 is masked by a first sensitivity film (such as photoresist) 37a. Then, a first impurity ion is lightly implanted into the region for high voltage operation of the substrate 31 using the second gate electrode 36 as a mask, so that first low-concentration impurity regions 38 are formed in the substrate at both sides of the second gate electrode 36. The first impurity ion includes phosphorus(P) of n conductivity type, which is different from the P type conductivity of the substrate 31.

Figure 3D:
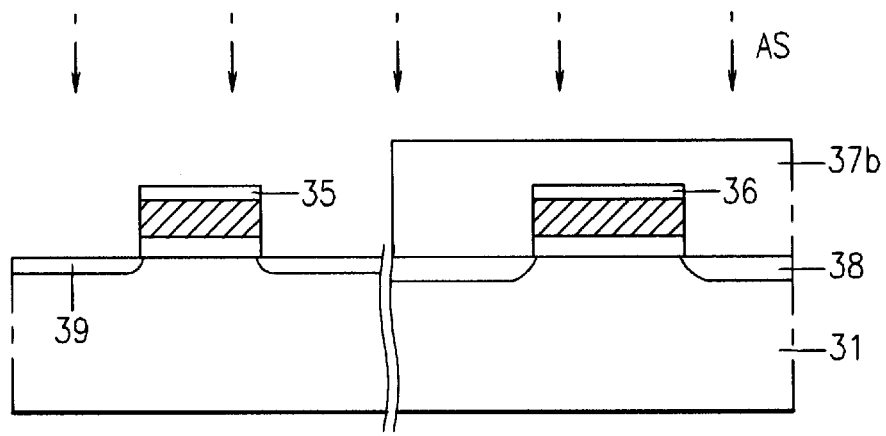

As shown in FIG. 3d, the first sensitivity film 37a of the region for low voltage operation is removed. Then, the region for high voltage operation including the second gate electrode 36 is masked by a second sensitivity film 37b. Subsequently, a second impurity ion is lightly implanted into the region for low voltage operation using the first gate electrode 35 as a mask. As a result, second low-concentration impurity regions 39 are formed in the substrate 31 at both sides of the first gate electrode 35. The second impurity ion includes As of N conductivity type.

Figure 3E:
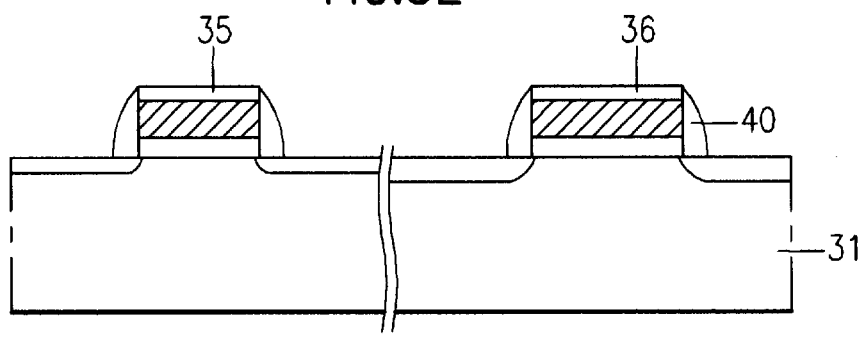

As shown in FIG. 3e, a third insulating film is formed on the substrate 31 including the first gate electrode 35 and the second gate electrode 36 after removing the second sensitivity film 37b of the region for high voltage operation. Then, insulated sidewall spacers 40 are formed at both sides of the first and second gate electrodes 35 and 36 by performing a responsive ion etching process on the third insulating film.

Figure 3F:
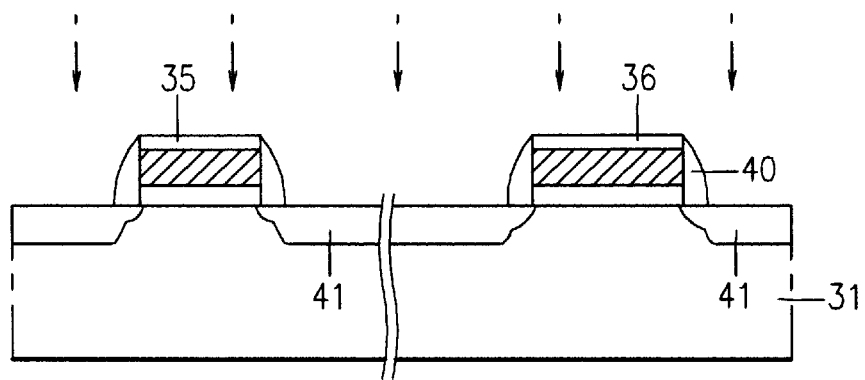

As shown in FIG. 3f, high-concentration impurity regions 41 are formed by heavily implanting the second impurity ion into the substrate 31 using the first gate electrode 35, the second gate electrode 36, and the insulated sidewall spacers 40 as a mask.

Figure 4:
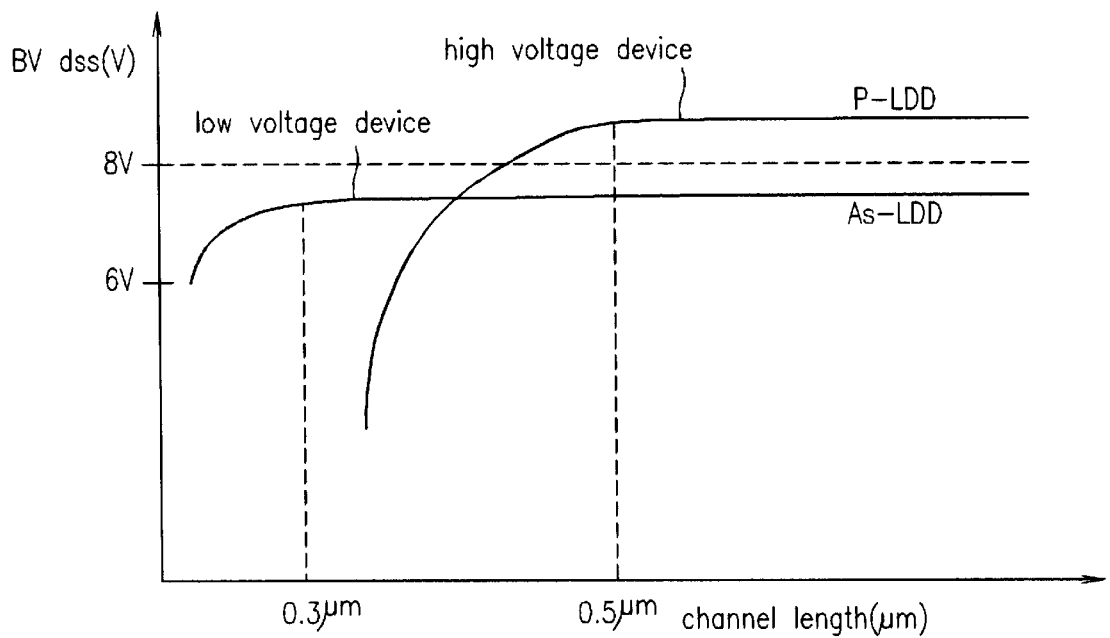
Figure 5:
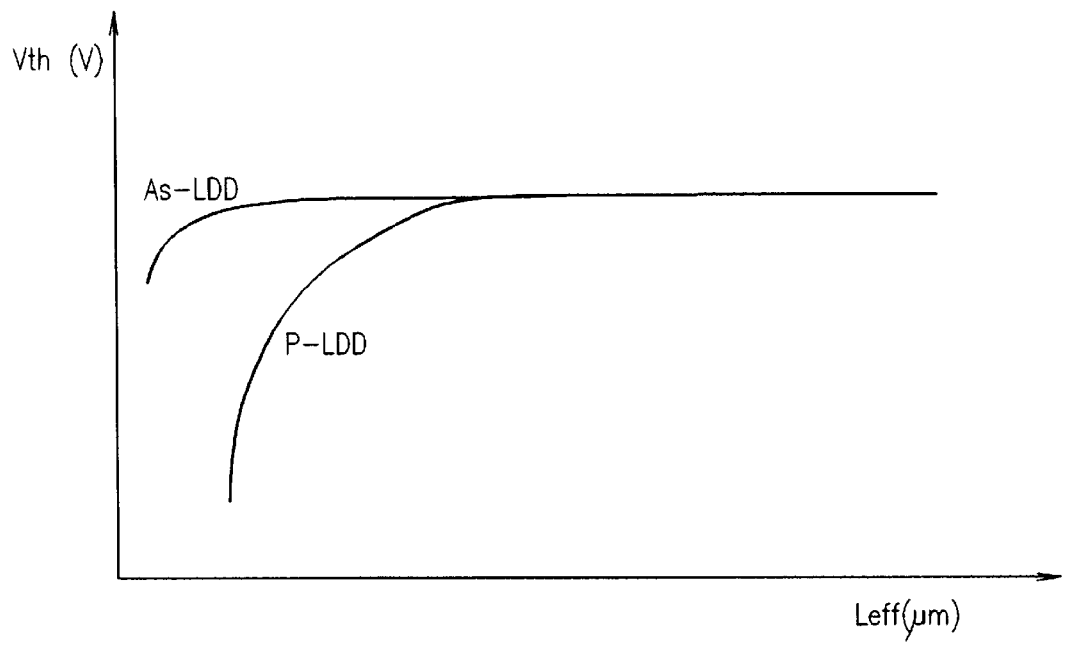
FIG. 5 is a graph showing the characteristics of a short channel length of P-LDD and As-LDD.

FIG. 4 is a graph showing the characteristics of a breakdown voltage BVdss relative to channel lengths of devices using P and As as an LDD-dose. FIG. 5 is a graph showing the characteristics of short channel of P-LDD and As-LDD.

As shown in FIG. 4 and FIG. 5, a high breakdown voltage BV of 8 V or more occurs in a high voltage device having a long channel of 0.5 um or more due to a wide doping profile when using P as an LDD-dose. A breakdown voltage of 6 V or more occurs in a low voltage device having a short channel of 0.3 um or more when using As as an LDD-dose.

Further, in case of P-LDD, short channel characteristics cannot be achieved in a low voltage device with a minimum channel length. In case of As-LDD, short channel characteristics can be achieved in a low voltage device.

The method of fabricating a semiconductor device according to the present invention has at least the advantages as follows.

To prevent characteristics of short channel from being deteriorating in case of P-LDD and to overcome a low breakdown voltage in case of As-LDD, P-LDD is used in a device in which a high voltage is applied with a long channel length, and As-LDD is used in a device in which a low voltage is applied with a minimum channel length. As a result, the reliability of a device is improved. In addition, the method of fabricating a semiconductor device according to the present invention has an advantage suitable for scaling down the dimensions of the device.

It will be apparent to those skilled in the art that various modifications and variations can be made in method of fabricating a semiconductor device of the present invention without departing from the spirit or scope of the invention. Thus, it is intended that the present invention cover the modifications and variations of this invention provided they come within the scope of the appended claims and their equivalents.

What is claimed is:

1. A method of fabricating a semiconductor device, the method comprising the steps of:

forming a first gate electrode and a second gate electrode over a semiconductor substrate at first and second regions of the semiconductor substrate, respectively;

implanting first impurity ions into the first region using the first gate electrode as a mask to form a first low-concentration impurity region;

implanting second impurity ions into the second region using the second gate electrode as a mask to form a second low-concentration impurity region, wherein a depth of the second low-concentration impurity region is less than a depth of the first low-concentration impurity region;

forming sidewall spacers at both sides of each of the first and second gate electrodes; and implanting the second impurity ions into the first and second regions using the first and second gate electrodes and the sidewall spacers as masks.

2. The method of fabricating a semiconductor device according to claim 1, wherein the step of forming the first gate electrode of the first region includes forming a corresponding first channel length, and the step of forming the second gate electrode of the second region includes forming a corresponding second channel length.

3. The method of fabricating a semiconductor device according to claim 1, wherein the first and second impurity ions have a same conductivity type.

4. The method of fabricating a semiconductor device according to claim 1, wherein the second impurity ions have a lower diffusivity than a diffusivity of the first impurity ions.

5. A method of fabricating a semiconductor device, the method comprising the steps of:

forming a first gate electrode and a second gate electrode on a substrate of a first conductivity type at first and second areas of the substrate, respectively;

masking the first area including the first gate electrode with a first material;

forming a first low-concentration impurity region having a first impurity concentration by implanting first impurity ions of a second conductivity type into the second area of the substrate using the second gate electrode as a mask;

removing the first material;

forming a second low-concentration impurity region having a second impurity concentration by implanting second impurity ions of the second conductivity type into the first area of the substrate using the first gate electrode as a mask, wherein a depth of the second low-concentration impurity region is less than a depth of the first low-concentration impurity region;

forming sidewall spacers at sides of the first and second gate electrodes; and forming a third impurity region having a third impurity concentration by implanting third impurity ions of the second conductivity type into the first and second areas using the first and second gate electrodes and the sidewall spacers as masks.

6. The method of fabricating a semiconductor device according to claim 5, wherein the step of forming the sidewall spacers includes the steps of:

forming an insulating film on the substrate and the first and second gate electrodes; and performing a responsive ion etching process on the insulating film to form the sidewall spacers.

7. The method of fabricating a semiconductor device according to claim 5, wherein the step of forming the first gate electrode of the first area includes forming a corresponding first channel length, and the step of forming the second gate electrode of the second area includes forming a corresponding second channel length.

8. The method of fabricating a semiconductor device according to claim 7, wherein the first channel length is shorter than the second channel length, and wherein the first impurity ions include phosphorus and the second impurity ions include arsenic.

9. The method of fabricating a semiconductor device according to claim 5, wherein the first and second impurity ions are of a same conductivity type.

10. The method of fabricating a semiconductor device according to claim 5, wherein the first impurity ions include phosphorus and the second impurity ions include arsenic.

11. The method of fabricating a semiconductor device according to claim 5, wherein the first and second impurity concentrations are substantially the same.

12. The method of fabricating a semiconductor device according to claim 5, wherein the first and second impurity concentrations are different.

13. The method of fabricating a semiconductor device according to claim 5, wherein the third impurity concentration is higher than the first and second impurity concentrations.

14. The method of fabricating a semiconductor device according to claim 5, wherein the second impurity ions and the third impurity ions are the same element.

15. The method of fabricating a semiconductor device according to claim 5, wherein the second impurity ions and the third impurity ion are different elements.

16. A method of fabricating a semiconductor device, the method comprising the steps of:

forming a first gate electrode and a second gate electrode on a substrate at first and second areas of the substrate, respectively;

masking the first area including the first gate electrode with a first material;

forming a first low-concentration impurity region having a first impurity concentration by implanting first impurity ions of a second conductivity type into the second area of the substrate using the second gate electrode as a mask;

removing the first material;

masking the second area with a second material after removing the first material;

forming a second low-concentration impurity region having a second impurity concentration by implanting second impurity ions of the second conductivity type into the first area of the substrate using the first gate electrode as a mask, wherein a depth of the second low-concentration impurity region is less than a depth of the first low-concentration impurity region;

removing the second material;

forming sidewall spacers at sides of the first and second gate electrodes; and forming a third impurity region having a third impurity concentration by implanting third impurity ions of the second conductivity type into the first and second areas using the first and second gate electrodes and the sidewall spacers as masks.

17. The method of fabricating a semiconductor device according to claim 16, wherein the step of forming the sidewall spacers includes the steps of:

forming an insulating film on the substrate and the first and second gate electrodes; and performing a responsive ion etching process on the insulating film to form the sidewall spacers.

18. The method of fabricating a semiconductor device according to claim 16, wherein the step of forming the first gate electrode of the first area includes forming a corresponding first channel length, and the step of forming the second gate electrode of the second area includes forming a corresponding second channel length.

19. The method of fabricating a semiconductor device according to claim 18, wherein the first channel length is shorter than the second channel length and the first impurity ions include phosphorus and the second impurity ions include arsenic.

20. The method of fabricating a semiconductor device according to claim 16, wherein the first and second impurity ions are of a same conductivity type.

21. The method of fabricating a semiconductor device according to claim 16, wherein the first impurity ions include phosphorus and the second impurity ions include arsenic.

22. The method of fabricating a semiconductor device according to claim 16, wherein the first and second impurity concentrations are substantially the same.

23. The method of fabricating a semiconductor device according to claim 16, wherein the first and second impurity concentrations are different.

24. The method of fabricating a semiconductor device according to claim 16, wherein the third impurity concentration is higher than the first and second impurity concentrations.

25. The method of fabricating a semiconductor device according to claim 16, wherein the second impurity ions and the third impurity ions are the same element.

26. The method of fabricating a semiconductor device according to claim 16, where the second impurity ions and the third impurity ions are different elements.

* * * * *